United States Patent [19]

Tanaka et al.

[11] Patent Number: 5,240,905
[45] Date of Patent: Aug. 31, 1993

[54] METHOD FOR FORMING ELECTRODE FOR ELECTRICAL CONNECTIONS TO OXIDE SUPER-CONDUCTOR

[75] Inventors: Saburo Tanaka; Hideo Itozaki; Shuji Yazu, all of Itami, Japan

[73] Assignee: Sumitomo Electric Industries, Ltd., Osaka, Japan

[21] Appl. No.: 827,185

[22] Filed: Jan. 28, 1992

Related U.S. Application Data

[62] Division of Ser. No. 585,548, Sep. 20, 1990, Pat. No. 5,147,849.

[30] Foreign Application Priority Data

Sep. 20, 1989 [JP] Japan .................................. 1-244316
Oct. 6, 1989 [JP] Japan .................................. 1-261492

[51] Int. Cl.⁵ .......................... B05D 5/12; H01L 39/12
[52] U.S. Cl. ............................ 505/1; 505/701; 505/706; 427/62; 427/125; 427/404; 427/405; 427/250; 156/643; 156/656
[58] Field of Search ............... 505/1, 706, 701; 427/62, 63, 404, 405, 125, 250; 428/930, 632, 673, 672; 156/643, 656

[56] References Cited

FOREIGN PATENT DOCUMENTS 0401461 12/1990 European Pat. Off. .
0406120  1/1991 European Pat. Off. .

OTHER PUBLICATIONS

Sugimoto et al., "Low Resistance Ohmic Contact for the Oxide Superconductor EuBa$_2$Cu$_3$O$_y$,", Jpn. J. Appl. Phys. 27(5) May 1988 pp. L864–L866.

Ma et al., "Characterization of Bilayer-Metal Contacts to High Tc Superconducting Films," J. Vac. Sci. Technol. A9(3), May/Jun. 1991 pp. 390–393.

Y. Iye et al., "A simple method for attaching electrical leads to small samples of high-Tc oxides", Japanese Journal of Applied Physics, vol. 27, No. 4, Apr. 1988, pp. 658–660, Tokyo, JP.

Y. Tazoh et al., "Low resistance ohmic contacts to high-Tc superconducting thin films", IEEE Transactions on Magnetics, vol. 25, No. 2, Aug. 1989, pp. 2049–2052, New York, US.

P. Y. Hsieh et al., "Electrical conductivity and buffer-layer studies of high Tc superconductors by C-V measurements", Proceedings of the 2nd Annual Conference on Superconductivity and its Applications, 18th Apr. 1988, pp. 214–222, Buffalo, US.

Primary Examiner—Roy King
Attorney, Agent, or Firm—Pennie & Edmonds

[57] ABSTRACT

A metal electrode formed on an oxide superconductor for electric connection to the oxide superconductor, includes a first layer of Ag in direct contact with the oxide superconductor, and a second layer formed on the first layer. The second layer is formed of noble metal excluding Ag. The metal electrode can be formed by forming a first layer of Ag to cover a whole surface of the oxide superconductor layer, and forming a second layer of noble metal excluding Ag, to cover a whole surface of the first layer, thereby to form a double metal layer, and patterning the double metal layer so as to form a metal electrode composed of the double metal layer.

10 Claims, 3 Drawing Sheets

5,240,905

METHOD FOR FORMING ELECTRODE FOR ELECTRICAL CONNECTIONS TO OXIDE SUPER-CONDUCTOR

This is a division of application Ser. No. 07/585,548, filed Sep. 20, 1990 now U.S. Pat. No. 5,147,849.

BACKGROUND OF THE INVENTION

1. Field of the Invention

The present invention relates to a superconductor device using a superconductor of compound oxide, and more specifically to an electrode for electric connection to a compound oxide superconductor which can be effectively implemented in a superconductor device using the compound oxide superconductor, as well as a method for forming the same electrode.

2. Description of Related Art

In applications of various types of compound oxide superconductors (called simply "oxide superconductor" hereinafter), superconductor electronic devices and superconductor wirings for electronic devices are ones of fields most hopefully expected to be put into practical use. Josephson devices, SQUIDs, superconductor transistors and superconductor circuit wirings formed of oxide superconductors have been already reported.

In general, superconductor devices include superconductive conductors or wirings which allow a so-called superconducting current to flow therethrough. However, in all of superconductor circuits and devices, the superconductive conductors or wirings have to be electrically connected to circuits or devices which operate under a normal conduction condition.

For this purpose, in the above mentioned superconductor devices, an electrical connection has been realized by using a thin metal wire such as an Au which is called a "bonding wire". If the superconductor is a metal superconductive material, the bonding wire can be fixed and electrically connected directly to a portion of the metal superconductor. However, if the superconductor is an oxide superconductive material, it is difficult to fix or secure the bonding wire to a portion of the oxide superconductor. In the case of the oxide superconductor, therefore, a metal electrode has been deposited on a portion of the superconductor by means of vacuum evaporation of noble metal such as Au (gold), and thereafter, a bonding wire has been fixed and electrically connected to the metal electrode thus formed on the oxide superconductor. Since the noble metal typified by Au is very low in reactivity, it will not give an adverse effect to the oxide superconductor. In addition, even if the noble metal typified by Au is in contact with air, it is hardly oxidized. In this point, the noble metal typified by Au is suitable for the electrode for the oxide superconductor.

However, the noble metal typified by Au does not have a good adhesion or bonding property to the oxide superconductor, and therefore, a contact resistance has often become large. Therefore, the superconductor device in which only a very small amount of electric current is flowed has become unstable in operation, and cannot often exert an expected performance.

Furthermore, when a metal electrode is formed on a portion of an oxide superconductor, after a metal film is deposited on an oxide superconductor thin film, the metal film is patterned. It has been an ordinary practice to perform the patterning by using a photolithography.

The following is one example of a "lift-off" process for forming a metal electrode on a thin film of oxide superconductor.

First, a thin film of oxide superconductor is formed on a substrate, which has been properly selected dependently upon the kind of an oxide superconductor to be formed. For example, substrate is formed of MgO. In addition, the film of oxide superconductor is deposited by means of sputtering, MBE (molecular beam epitaxy), CVD (chemical vapor deposition) or other suitable process.

Then, a photoresist layer is deposited on the thin film of oxide superconductor, and patterned so that an opening for allowing deposition of metal electrode is formed in the deposited photoresist layer. In the opening of the patterned photoresist layer, the thin film of oxide superconductor is exposed.

Furthermore, metal is deposited by, for example, vacuum evaporation, so that the metal is deposited directly on the thin film of oxide superconductor exposed in the opening of the pattern photoresist layer.

Thereafter, the photoresist layer is removed, so that the metal layer deposited on the photoresist layer is removed together. Thus, the metal layer remains only on a position of the thin film of oxide superconductor corresponding to the opening of the photoresist layer. Namely, a metal electrode having a configuration corresponding to the opening of the photoresist layer is formed on the thin film of oxide superconductor.

However, the above mentioned conventional metal electrode forming method is disadvantageous in that, since the photoresist layer is deposited directly on a surface of the thin film of oxide superconductor, an interfacial reaction occurs, and therefore, the characteristics of the oxide superconductor is deteriorated. In addition, in the process of the photolithography, since the oxide superconductor is in contact with an alkaline developing liquid and a cleaning water, the characteristics of the oxide superconductor is further deteriorated.

SUMMARY OF THE INVENTION

Accordingly, it is an object of the present invention to provide a metal electrode for electric connection to an oxide superconductor, which has overcome the above mentioned defect of the conventional one and which has a good adhesion or bonding property to the oxide superconductor and a sufficiently low contact resistance.

Another object of the present invention is to provide a method for forming a metal electrode for electric connection to an oxide superconductor, without deteriorating the characteristics of the oxide superconductor.

The above and other objects of the present invention are achieved in accordance with the present invention by a metal electrode formed on an oxide superconductor for electric connection to the oxide superconductor, the metal electrode including a first layer of Ag (silver) in direct contact with the oxide superconductor, and a second layer formed on the first layer, the second layer being formed of noble metal excluding Ag.

According to another aspect of the present invention, there is provided a method for forming a metal electrode on an oxide superconductor layer for electric connection to the oxide superconductor layer, comprising the steps of forming a first layer of Ag to cover a whole surface of the oxide superconductor layer, and forming a second layer of noble metal excluding Ag, to cover a whole surface of the first layer, thereby to form a double metal layer, and patterning the double metal layer so as to form a metal electrode composed of the double metal layer.

As seen from the above, the metal electrode in accordance with the present invention for electric connection to the oxide superconductor is mainly characterized in that the metal electrode is composed of two layers, namely, a first layer of Ag in direct contact with the oxide superconductor, and a second layer formed on the first layer and formed of noble metal excluding Ag. Since Ag is remarkably low in reactivity to oxide superconductors. Ag will never give an adverse influence to the oxide superconductor. In addition, Ag has a low contact resistance with oxide superconductors and an excellent adhesion or bonding property to oxide superconductor. This is a characteristics peculiar or inherent to Ag. The electrode in accordance with the present invention utilizes this characteristics of Ag.

On the other hand, Ag is easily oxidized in air. In this aspect, Ag is not preferable as an electrode material. However, noble metal such as Au, excluding Ag, is hardly oxidized in air. Therefore, in this aspect, the noble metal excluding Ag is preferable as an electrode material. However, the noble metal excluding Ag is poor in bonding property to oxide superconductor, so that a substantial contact resistance often occurs.

Thus, in order to realize a metal electrode which has a good bonding property to oxide superconductor without adversely affecting the oxide superconductor, and which is never easily oxidized in air, the metal electrode in accordance with the present invention is composed of a double metal layer having such a construction that a portion in direct contact with an oxide superconductor is formed of an Ag layer and a portion in contact with air is formed of a layer of noble metal excluding Ag, for example, Au or Pt (platinum).

Preferably, a thickness of the Ag layer and a thickness of the noble metal layer formed on the Ag layer are in a range of 0.01 $\mu$m to 1 $\mu$m and in a range of 0.05 $\mu$m to 1 $\mu$m, respectively. If the thickness of the Ag layer is less than 0.05 $\mu$m, the Ag layer has no effect of protecting the oxide superconductor. On the other hand, even if the thickness of the Ag layer is greater than 1 $\mu$m, the effect of protecting the oxide superconductor is not increased, and rather, a long time becomes required for removal of unnecessary portion of the metal layer after a photolithography process. Similarly, if the thickness of the noble metal layer is less than 0.05 $\mu$m, the noble metal layer has no effect of protecting the Ag layer, and is not sufficient to allow the electrode to function. On the other hand, even if the thickness of the noble metal layer is greater than 1 $\mu$m, the effect of protecting the Ag layer is not increased, and rather, a long time becomes required for removal of unnecessary portion of the metal layer after a photolithography process. Therefore, the above mentioned ranges of thickness are preferred.

The method in accordance with the present invention is characterized by covering a whole surface of an oxide superconductor layer with a double metal layer composed of a Ag sub-layer and another sub-layer of noble metal excluding Ag, and then, patterning the double metal layer into a form of an electrode. In this method in accordance with the present invention, since the oxide superconductor layer is in direct contact with neither photoresist nor developing liquid, the characteristics of the oxide superconductor will never be deteriorated by the photoresist or the developing liquid.

The metal electrode in accordance with the present invention can be fabricated by using a deposition process which has been used for fabrication of conventional electrodes. In this connection, it is preferred that after formation of the double metal layer, the metal electrode in accordance with the present invention is heated so as to improve an adhesion or bonding property between the Ag layer and the oxide superconductor layer. Preferably, the heat treatment is performed in a range of 300° C. to 580° C. If the heating temperature is less than 300° C., the heating treatment is not so effective in improving the bonding property. On the other hand, if the heating temperature is greater than 580° C., a reaction layer is formed, so that the characteristics of the oxide superconductor is deteriorated. It is more effective if the heating is performed in atmosphere of oxygen. In this case, the heating processing is preferably performed after completion of formation of the second layer of noble metal excluding Ag, in order to protect the Ag layer from oxidation.

Furthermore, in the method of the present invention, the etching after photolithography is preferably performed by a dry etching process, for example, an ion beam etching using inert gas such as Ar, an ECR (electron cycroton resonance) etching, an RF (radio frequency) plasma etching, etc. These etching processes are very preferable, since a physical etching is realized by charged particles without chemical reaction, and therefore with less influence to the oxide superconductor.

The above and other objects, features and advantages of the present invention will be apparent from the following description of preferred embodiments of the invention with reference to the accompanying drawings. However, the examples explained hereinafter are only for illustration of the present invention, and therefore, it should be understood that the present invention is in no way limited to the following examples.

DESCRIPTION OF THE PREFERRED EMBODIMENTS

Figure 1:
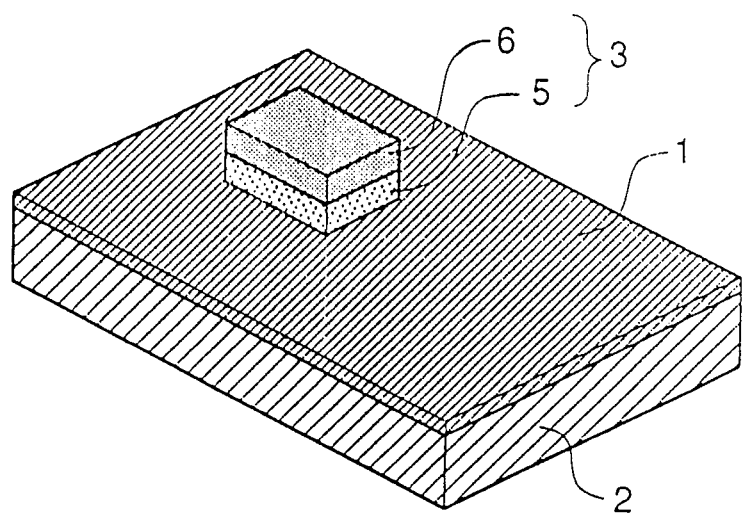
FIG. 1 is a diagrammatic perspective view illustrating a structure of a metal electrode in accordance with the present invention for an electric connection to an oxide superconductor.

A metal electrode in accordance with the present invention having a configuration as shown in FIG. 1 and a conventional metal electrode were formed on various types of oxide superconductor layers, and comparison was performed about characteristics of the electrodes. As shown in FIG. 1, on a thin film 1 of an oxide superconductor formed on an insulative substrate 2, there is formed a metal electrode 3 constituted of an lower metal sub-layer 5 of Ag and an upper metal sub-layer 6 of Au.

In examples explained hereinafter, a contact resistance in a metal electrode for electric connection to an oxide superconductor was measured by using a so-called "three-terminal method" and a so-called "four-terminal method" in combination.

Figure 2A:
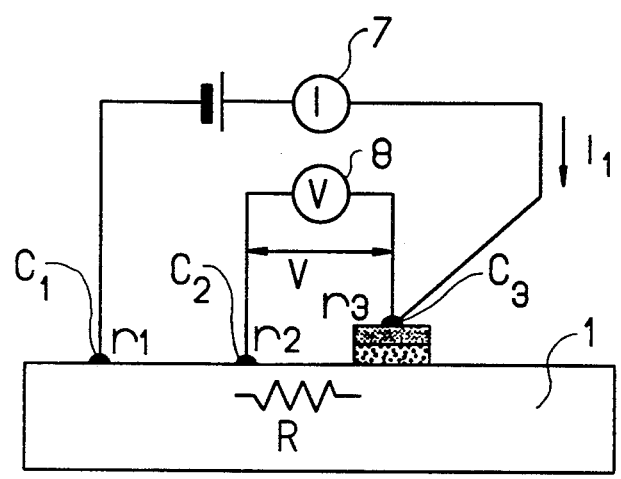
FIGS. 2A and 2B illustrate a method of measuring a contact resistance in the metal electrode for the oxide superconductor.

First, as illustrated in FIG. 2A, conventional electric contacts $C_1$ and $C_2$ and an electric contact or electrode $C_3$ in accordance with the present invention are formed on the oxide superconductor thin film 1. An electric current I is flowed between the contacts $C_1$ and $C_3$ and is measured by an ammeter 7. On the other hand, a voltmeter 8 is connected between the contacts $C_2$ and $C_3$ so that an electric voltage V between the contacts $C_2$ and $C_3$ is measured by the voltmeter 8. Here, it is assumed that contact resistances at the contacts $C_1$, $C_2$ and $C_3$ are $r_1$, $r_2$ and $r_3$, respectively, and an equivalent resistance in a portion of the superconductor thin film 1 between the contacts $C_2$ and $C_3$ is R. It is also assumed that an internal impedance of the voltmeter 8 is infinite.

Under the above mentioned arrangement, the voltmeter 8 measures a voltage drop V occurring when the current I flows in series through the equivalent resistance R of the superconductor thin film 1 and the contact resistance $r_3$. Therefore, $$r_3 = (V/I) - R \quad (1)$$

Figure 2B:
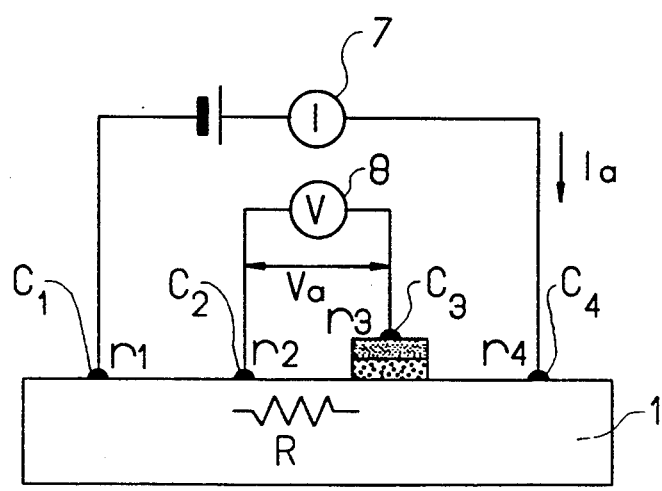

Furthermore, as illustrated in FIG. 2B, a conventional electric contact $C_4$ is formed on the superconductor thin film 1. An electric current Ia is flowed between the contacts $C_1$ and $C_4$ and is measured by the ammeter 7. On the other hand, an electric voltage Va between the contacts $C_2$ and $C_3$ is measured by the voltmeter 8. Here, it is assumed that a contact resistance at the contact $C_4$ is $r_4$.

In this case, the voltmeter 8 measures a voltage drop Va occurring when the current Ia flows in series through only the equivalent resistance R of the superconductor thin film 1. Therefore, $$Va = Ia \cdot R \quad (2)$$

Accordingly, the following equation can be derived from the above equations (1) and (2).

$$r_3 = (V/I) - (Va/Ia) \quad (3)$$

Thus, the contact resistance $r_3$ in the electric contact or electrode $C_3$ to the oxide superconductor in accordance with the present invention can be measured by a sequential measurement of the "three-terminal method" and the "four-terminal method", without being influenced by values of $r_1$, $r_2$ and $r_4$, and R.

EXAMPLE 1

A metal electrode was formed on an oxide superconductor thin film in accordance with the present invention. A process for formation of the metal electrode will be explained with reference to FIGS. 3A to 3F.

Figure 3A:
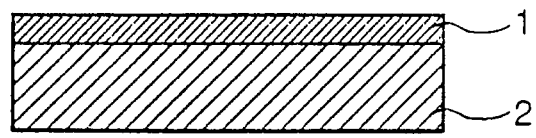
FIGS. 3A, 3B, 3C, 3D, 3E and 3F illustrate one embodiment of the process in accordance with the present invention for fabricating the metal electrode in accordance with the present invention for an electric connection to an oxide superconductor.

As shown in FIG. 3A, an oxide superconductor thin film 1 of $Y_1Ba_2Cu_3O_x$ ($6 < x \leq 7$) having a thickness of 0.5 μm was formed on a monocrystalline substrate 2 of MgO (100) by sputtering. The oxide superconductor thin film 1 of $Y_1Ba_2Cu_3O_x$ thus formed had a critical temperature Tc of 90K.

Figure 3B:
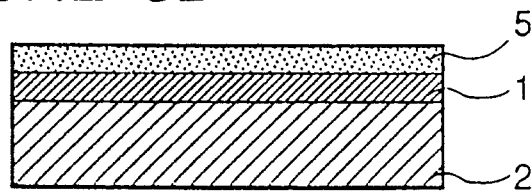
Figure 3C:
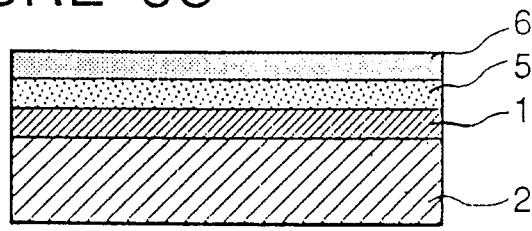

As shown in FIG. 3B, an Ag layer 5 having a thickness of 0.15 μm was deposited on a whole surface of the oxide superconductor thin film 1 of $Y_1Ba_2Cu_3O_x$ by means of a vacuum evaporation process. In addition, an Au layer 6 having a thickness of 0.10 μm was also deposited on a whole surface of the Ag layer 5 by means of a vacuum evaporation process, as shown in FIG. 3C.

The condition for the above vacuum evaporations was as follows:

| Heating of the substrate | No heating |
|---|---|
| Degree of vacuum | 1 to 3 × $10^{-6}$ torr |
| Deposition rate | 2 to 3 Å/second |

After formation of the Au layer 6, the substrate was heated at a temperature of 300°C. for 10 minutes in an atmospheric pressure oven supplied with a flow of oxygen.

Figure 3D:
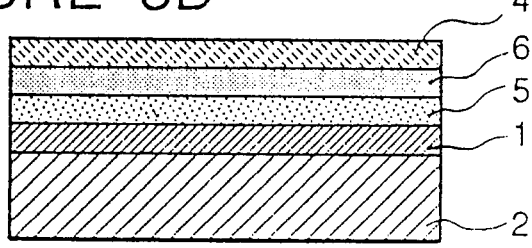
Figure 3E:
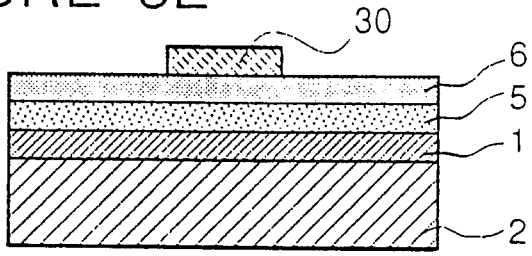

Thereafter, as shown in FIG. 3D, a photoresist layer 4 was formed on the Au layer 6. Then, as shown in FIG. 3E, the photoresist layer 4 was patterned to form a photoresist pattern 30 at a position on which a metal electrode is to be formed.

Figure 3F:
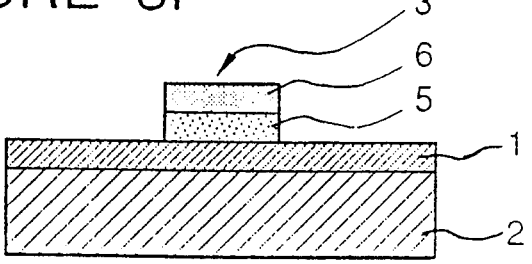

An exposed portion of the double metal layer was etched by means of an Ar ion beam etching process using a Kaufman type ion gun. The etching was terminated when the Ag layer of the exposed double metal layer was completely removed. A remaining resist layer was removed in an ashing process by using $O_2$ plasma. Thus, a metal electrode 3 constituted of the Ag layer 5 and the Au layer 6 was formed as shown in FIG. 3F.

In addition, for comparison, a metal electrode consisting of only a single Au layer having a thickness of 0.25 μm and having the same configuration as that of the metal electrode 3 was formed, in accordance with the conventional method explained hereinbefore, on an oxide superconductor thin film of $Y_1Ba_2Cu_3O_x$ having the same characteristics.

The oxide superconductor thin film of $Y_1Ba_2Cu_3O_x$, on a surface of which the metal electrode was formed in accordance with the present invention, had the critical temperature Tc of 90K without change even after formation of the metal electrode. In the oxide superconductor thin film of $Y_1Ba_2Cu_3O_x$ formed with the Au electrode in accordance with the conventional process, the critical temperature Tc after formation of the metal electrode dropped from 90 K. to 80 K.

In addition, a contact resistance between the respective electrodes and the oxide superconductor was measured at a temperature of 77.3 K. The contact resistance of the electrode in accordance with the present invention was $5.6 \times 10^{-8}$ $\Omega cm^2$. On the other hand, the contact resistance of the Au single layer electrode in accordance with the prior art was $6.4 \times 10^{-5}$ $\Omega cm^2$.

Furthermore, the Au electrode formed in accordance with the prior art was poor in the bonding property between the electrode and the oxide superconductor thin film, and easily peeled off. However, none of the defects was found in the Ag/Au electrode formed in accordance with the present invention.

EXAMPLE 2

In a process similar to that of the Example 1, an Au/Ag electrode was formed on an oxide superconductor thin film of $Bi_2Sr_2Ca_2Cu_3O_y$ ($7 \leq y \leq 10$) having a thickness of 0.5 μm. Then, a critical temperature Tc of the oxide superconductor thin film of $Bi_2Sr_2Ca_2Cu_3O_y$ was measured before and after formation of the electrode. In addition, an Au electrode was formed in accordance with the conventional method on an oxide superconductor thin film of $Bi_2Sr_2Ca_2Cu_3O_y$ having the same characteristics, and similarly, a critical temperature Tc of the oxide superconductor thin film was measured before and after formation of the electrode. The result is shown in the following table.

|  | Before formation of electrode | After formation of electrode |
| --- | --- | --- |
| Invention | 105 K | 105 K |
| Comparative | 105 K | 85 K |

In the oxide superconductor thin film having the Au electrode formed in accordance with the conventional process, not only the critical temperature Tc of the oxide superconductor thin film dropped after formation of the metal electrode, but also the electrode was poor in the bonding property and easily peeled off.

The following is the contact resistance between the respective electrodes and the oxide superconductor which was measured at a temperature of 77.3 K. in the same manner as that in the Example 1.

|  | Invention | Comparative |
| --- | --- | --- |
| Contact resistance ($\Omega$ cm$^2$) | $6.3 \times 10^{-8}$ | $7.2 \times 10^{-5}$ |

EXAMPLE 3

In a process similar to that of the Example 1, an Au/Ag electrode was formed on an oxide superconductor thin film of $Tl_2Ba_2Ca_2Cu_3O_z$ ($7 \leq z \leq 10$) having a thickness of 0.5 $\mu$m. Then, a critical temperature Tc of the oxide superconductor thin film of $Tl_2Ba_2Ca_2Cu_3O_z$ was measured before and after formation of the electrode. In addition, an Au electrode was formed in accordance with the conventional method on an oxide superconductor thin film of $Tl_2Ba_2Ca_2Cu_3O_z$ having the same characteristics, and similarly, a critical temperature Tc of the oxide superconductor thin film was measured before and after formation of the electrode. The result is shown in the following table.

|  | Before formation of electrode | After formation of electrode |
| --- | --- | --- |
| Invention | 114 K | 114 K |
| Comparative | 114 K | 98 K |

In the oxide superconductor thin film having the Au electrode formed in accordance with the conventional process, not only the critical temperature Tc of the oxide superconductor thin film dropped after formation of the metal electrode, but also the electrode was poor in the bonding property and easily peeled off.

The following is the contact resistance between the respective electrodes and the oxide superconductor which was measured at a temperature of 77.3 K. in the same manner as that in the Example 1.

|  | Invention | Comparative |
| --- | --- | --- |
| Contact resistance ($\Omega$ cm$^2$) | $6.8 \times 10^{-8}$ | $7.4 \times 10^{-5}$ |

As seen from the above, the electrode composed of a normal conductor in accordance with the present invention for electrical connection to an oxide superconductor thin film is excellent in the bonding property to the oxide superconductor as compared with the conventional ones, and is smaller in contact resistance than the conventional ones. Therefore, if the electrode in accordance with the present invention is used in a superconductor device, it is expected that noise is decreased and performance is improved.

In addition, the method of the present invention makes it possible to form a metal electrode on an oxide superconductor layer without deteriorating the characteristics of the oxide superconductor layer. Therefore, the method of the present invention can be expected to facilitate application of oxide superconductors to superconductor devices including Josephson devices and superconductor transistors.

The invention has thus been shown and described with reference to the specific embodiments. However, it should be noted that the present invention is in no way limited to the details of the illustrated structures but changes and modifications may be made within the scope of the appended claims.

We claim:

1. A method for forming a metal electrode on an oxide superconductor layer for electric connection to the oxide superconductor layer, comprising the steps of forming a first layer of Ag to cover a whole surface of the oxide superconductor layer, and forming a second layer of noble metal excluding Ag, to cover a whole surface of said first layer, thereby to form a double metal layer, and patterning said double metal layer so as to form on the oxide superconductor layer a metal electrode composed of said double metal layer.

2. A method claimed in claim 1 wherein said second layer is made of Au.

3. A method claimed in claim 2 wherein a thickness of said first layer of Ag is in a range of 0.01 $\mu$m to 1 $\mu$m and a thickness of said second layer of Au is in a range of 0.05 $\mu$m to 1 $\mu$m.

4. A method claimed in claim 3 wherein after formation of said double metal layer, a heating treatment is performed in order to improve a bonding property between said double metal layer and said oxide superconductor layer.

5. A method claimed in claim 4 wherein said heating treatment is performed under an atmosphere of oxygen in a temperature range of 300° C. to 580° C.

6. A method claimed in claims 4 wherein after said heating treatment, a resist pattern is deposited on said double metal layer, and then, said double metal layer is selectively removed by a physical dry etching process using said resist pattern as a mask, so that said metal electrode is formed.

7. A method claimed in claim 6 wherein said heating treatment is performed under an atmosphere of oxygen in a temperature range of 300° C. to 580° C.

8. A method claimed in claim 1 wherein a thickness of said first layer of Ag is in a range of 0.01 $\mu$m to 1 $\mu$m and a thickness of the second layer of noble metal excluding Ag is in a range of 0.05 $\mu$m to 1 $\mu$m.

9. A method claimed in claim 1 wherein after formation of said double metal layer, a heating treatment is performed in order to improve a bonding property between said double metal layer and said oxide superconductor layer.

10. A method claimed in claims 1 wherein after formation of said double metal layer, a resist pattern is deposited on said double metal layer, and then, said double metal layer is selectively removed by a physical dry etching process using said resist pattern as a mask, so that said metal electrode is formed.

* * * * *